(12) United States Patent
Takahashi et al.

(10) Patent No.: US 8,004,306 B2
(45) Date of Patent: Aug. 23, 2011

(54) SEMICONDUCTOR DEVICE

(75) Inventors: Hiroyuki Takahashi, Kanagawa (JP);
Hiroshi Furuta, Kanagawa (JP)

(73) Assignee: Renesas Electronics Corporation,
Kanagawa (JP)

( * ) Notice: Subject to any disclaimer, the term of this patent is extended or adjusted under 35 U.S.C. 154(b) by 89 days.

(21) Appl. No.: 11/508,287

(22) Filed: Aug. 23, 2006

(65) Prior Publication Data

US 2007/0064470 A1    Mar. 22, 2007

(30) Foreign Application Priority Data

Sep. 16, 2005    (JP) ................................. 2005-270537

(51) Int. Cl.
*G01R 31/26*    (2006.01)
(52) U.S. Cl. ...................................... 324/765; 324/76.52
(58) Field of Classification Search ............... 324/76.52, 324/76.77, 765
See application file for complete search history.

(56) References Cited

U.S. PATENT DOCUMENTS

| | | | | |
|---|---|---|---|---|
| 5,410,263 | A * | 4/1995 | Waizman | 327/141 |
| 6,351,190 | B1 * | 2/2002 | O'Toole et al. | 331/57 |
| 6,501,336 | B2 * | 12/2002 | Kim et al. | 331/10 |
| 6,680,992 | B1 * | 1/2004 | Morikawa et al. | 375/376 |
| 6,977,828 | B2 * | 12/2005 | Wada | 363/60 |
| 7,295,502 | B2 * | 11/2007 | Minemura | 369/59.11 |
| 7,447,919 | B2 * | 11/2008 | Liepe et al. | 713/300 |

FOREIGN PATENT DOCUMENTS

| | | |
|---|---|---|
| JP | 2004-221697 | 8/2004 |
| JP | 2004-328843 | 11/2004 |

OTHER PUBLICATIONS

Machine Translation of JP2004-221697 of record, Jan. 9, 2008, provided by JPO, dictionary updated Dec. 14, 2007.*
Matakias, S. et al., "A circuit for concurrent detection of soft and timing errors in digital CMOS ICs", Jour. of Electronic Testing, Kluwer Academic Pub., 20, 2004, p. 523-531.*
Norbert Seifert, et al., "Frequency Dependent of Soft Error Rates for Sub-micron CMOS Technologies", International Electron Device Meeting Technical Digest pp. 323-326.
Pitsini Mongkolkachit et al., "Design Technique for Mitigation of Alpha-Particle-Induce Single-Event Transients in Combination Logic", IEEE Transaction on Device and Materials Reliability, vol. 3, No. 3, pp. 89-92.

* cited by examiner

*Primary Examiner* — Thomas Valone
(74) *Attorney, Agent, or Firm* — Young & Thompson (57) ABSTRACT

A semiconductor device according to an embodiment of the present invention includes: an oscillating circuit including a plurality of logic circuits connected in series; and an error detecting circuit receiving output signals of at least two of the plurality of logic circuits, and suspending an operation of the oscillating circuit to notify other blocks of the oscillating circuit that an error occurs in the oscillating circuit if a phase difference between the output signals is not within a predetermined phase difference range.

16 Claims, 5 Drawing Sheets

SEMICONDUCTOR DEVICE

BACKGROUND OF THE INVENTION

1. Field of the Invention

The present invention relates to a semiconductor device, and more particularly to a semiconductor device for detecting soft errors generated in a ring oscillator circuit or other such oscillators and preventing malfunction resulting from soft errors.

2. Description of Related Art

Along with recent miniaturization in a semiconductor process of a semiconductor device composed of field effect transistors such as MOSFETs, a transient error (soft error) resulting from radiation (for example, high-energy neutron radiation, thermal neutron radiation, and $\alpha$ radiation) has been recognized as a problem. As an example of the soft error, there is SEU (Single Event Upset) that logic inversion occurs due to charges accumulated in a node decrease due to charges resulting from radiation. In general, the occurrence of the SEU depends on a trade-off between an amount of charges accumulated in an information storage node (node voltage × node capacitance) and an amount of charges gathered to the information storage node (collected charge amount) out of the charges generated in a substrate due to radiation. The collected charge amount is generally proportional to an area (volume, to be exact) of the information storage node. As a result of experiments made by the inventors of the present invention, it is revealed that a smaller diffusion layer has a higher resistance to the SEU as long as a voltage level is constant. If a voltage decreases due to miniaturization, the decreasing rate is determined depending on a relation between the accumulated charge amount and the collected charge amount as mentioned above.

The SEU causes a problem of, for example, data inversion that data stored in a memory cell is different from the original data. To give a typical countermeasure against the SEU, a capacitor is added to the storage node or an ECC (Error Correction Code) is added to a circuit.

The memory cell can avoid the SEU by taking the above countermeasure. However, if this countermeasure is adopted against a SEU that occurs in a circuit transmitting a clock signal or the like, an operational speed is reduced or a chip area is considerably increased, so this countermeasure is inappropriate.

In contrast to the SEU (data inversion) of the memory cell, SET (Single Event Transient) is a signal transmission error resulting from a noise generated by radiation being emitted to a signal transmitting logic circuit (hereinafter referred to as "dynamic circuit" for convenience' sake).

Regarding the SET, it is reported by Norbert Seifert, et al. in "Frequency Dependent of Soft Error Rates for Sub-micron CMOS Technologies" that the SEU is more likely to occur in a circuit having more signal paths and higher operational frequency. This relation can be expressed as model expressions, Expressions 1 and 2:

$$Pset \propto f \text{ (f=operational frequency)} \quad (1)$$

$$Pset \propto N \text{ (N=target signal path)} \quad (2)$$

where Pset represents an error occurrence rate.

That is, as an operational frequency of a semiconductor integrated circuit improves, the occurrence of the SET increases as understood from Expression 1. As miniaturization in the semiconductor process proceeds and a circuit is upsized, the occurrence of the SET increases as understood from Expression 2.

As a countermeasure against the SET, a technique of preventing the SET using a majority circuit or a coincidence circuit is described in Pitsini Mongkolkachit et al., "Design Technique for Mitigation of Alpha-Particle-Induced Single-Event Transients in Combinational Logic". However, incorporating the majority circuit or coincidence circuit increases a circuit area, so there is a possibility that necessary functional parts cannot be embedded in a limited area.

Figure 7:
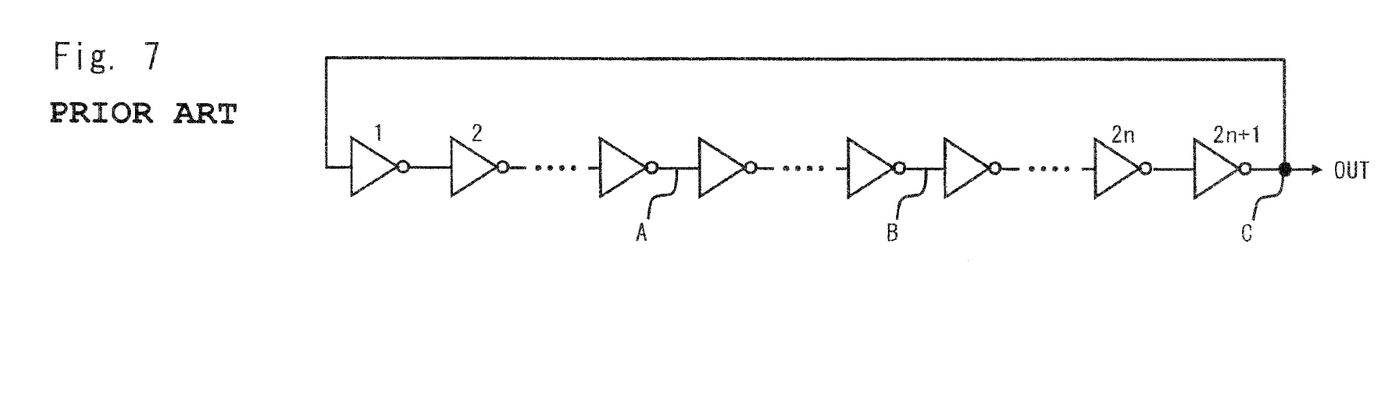
FIG. 7 is a circuit diagram of a conventional ring oscillator circuit.

In general, most blocks of the semiconductor integrated circuit have an active mode and a suspend mode. The SET is an error that occurs in the active mode. As understood from the above explanation, parts that are operating at high speeds all the time most need the measure for the SET. Examples of the parts include a ring oscillator circuit for generating an internal clock of the semiconductor integrated circuit. FIG. 7 shows an example of a conventional typical ring oscillator circuit.

Figure 8:
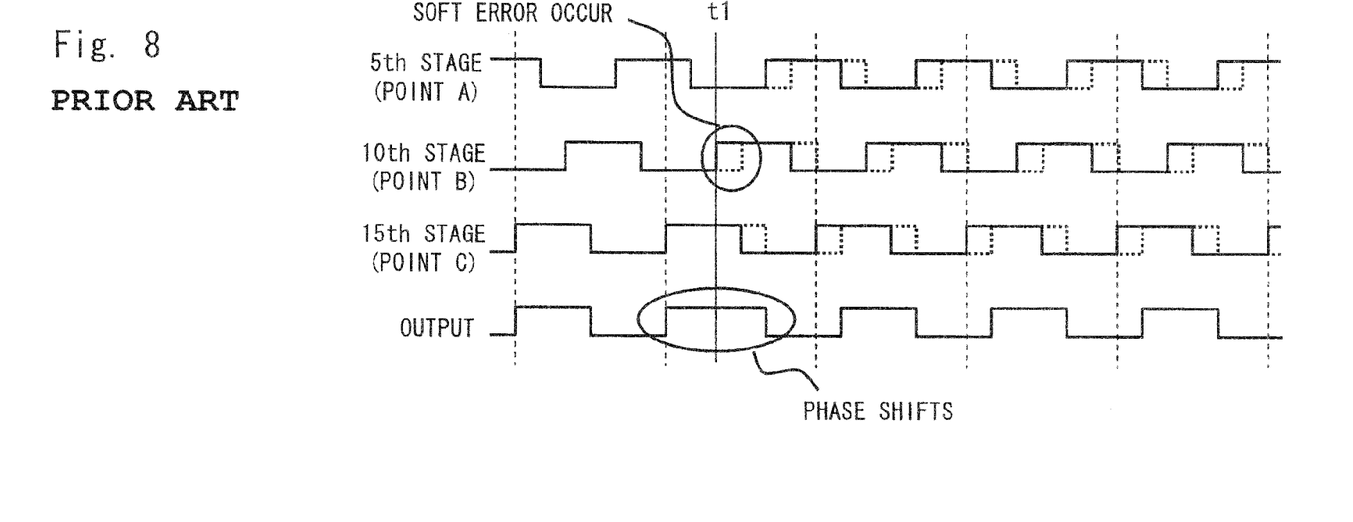
FIG. 8 is a timing chart of the conventional ring oscillator circuit in the case where soft errors occur.

In the ring oscillator circuit of FIG. 7, an odd number of inverter circuits are connected in series, and an output of the last inverter circuit is an input of the first inverter circuit. In the related art of FIG. 7, if n=7, 15 inverter circuits are connected. FIG. 8 is a timing chart of an operation of the ring oscillator. As shown in FIG. 8, if no soft error occurs, a 5-th circuit (point A), a 10-th circuit (point B), and a 15-th circuit (point C) show waveforms as indicated by the solid lines.

However, if soft errors occur in an output of the 10-th inverter circuit at time t1, and a signal that would be at High level under ordinary circumstances is changed to Low level, the circuit shows a waveform as indicated by dotted line from time t1 onward. That is, from time t1 onward, a phase of a waveform at each point advances relative to the waveform before time t1. The soft error is propagated. When the error reaches the output stage, a High-level period is increased before and after time t1 in FIG. 8, and a phase of an output waveform is shifted during this period. As a result, the output waveform is changed such that its phase advances. If the output waveform having the phase shift is input to other logic circuits, the circuits may cause a problem such as an error in reading data or an operational failure due to a timing difference.

Further, after the wave of the waveform changed by the soft errors propagates to all inverter circuits of the ring oscillator circuit, that is, after one cycle of the output waveform, relative phase differences between the inverter circuits become the original phase differences. Hence, the above problem does not occur.

Japanese Unexamined Patent Application Publication Nos. 2004-221697 and 2004-328843 disclose a technique of controlling an oscillating waveform of an oscillating circuit like the ring oscillator circuit. The circuit as disclosed in Japanese Unexamined Patent Application Publication No. 2004-221697 adjusts a control voltage of a voltage control oscillator to normalize oscillation of the oscillator when a oscillation stopped period is more than a predetermined period.

Further, the circuit as disclosed in Japanese Unexamined Patent Application Publication No. 2004-328843 controls an output signal of an oscillating circuit while comparing an output voltage with a reference voltage in a DC/DC converter for generating a predetermined voltage by use of a signal output from the oscillating circuit.

However, the circuits disclosed in Japanese Unexamined Patent Application Publication Nos. 2004-221697 and 2004-328843 detect a continuous waveform abnormality and thus cannot detect a waveform abnormality that occurs only once in a short period, such as soft errors.

SUMMARY OF THE INVENTION

According to a semiconductor device of the present invention, output waveforms of at least two of a plurality of logic circuits are monitored. If a phase difference between the output waveforms is not within a predetermined range, an error detecting circuit detects this. Based on the detection result, the error detecting circuit outputs a reset signal to notify another block that an error occurs in the oscillating circuit. Hence, even if soft errors occur in the oscillating circuit, the overall operation of the semiconductor device is kept normal without propagating the soft error.

According to the present invention, it is possible to detect the occurrence of soft errors based on a phase difference of a system of one oscillating circuit. Hence, according to the circuit of the present invention, it is unnecessary to prepare a plurality of circuits of the same configuration unlike a conventional majority circuit or coincidence circuit, making it possible to save a circuit area.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

A semiconductor device according to a first embodiment of the present invention includes an oscillating circuit (for example, ring oscillator circuit) 10 and an error detecting circuit 20. In the semiconductor device of the first embodiment, when soft errors occur in the ring oscillator circuit 10, and a phase difference larger than a predetermined difference is caused in a waveform generated in a ring oscillator circuit, the error detecting circuit 20 detects the phase difference to output an error detection signal (for example, reset signal) and notify other circuit blocks of the error occurrence.

Figure 1:
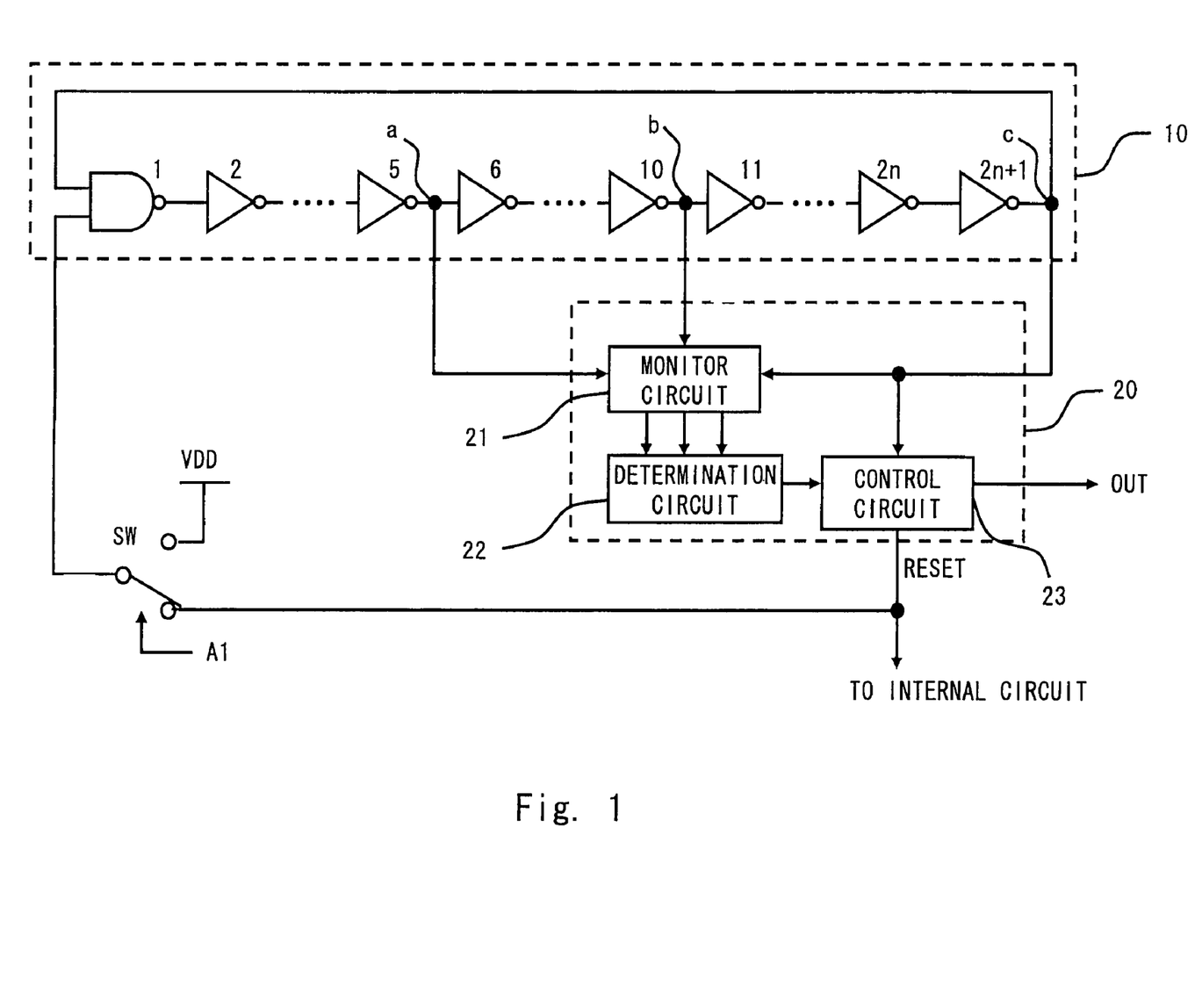
FIG. 1 is a block diagram of a ring oscillator circuit and an error detecting circuit according to a first embodiment of the present invention.

FIG. 1 shows the ring oscillator circuit 10 and the error detecting circuit 20 of the first embodiment. As shown in FIG. 1, the ring oscillator circuit 10 includes plural, an odd number (2n+1: n is an integer) of logic circuits (for example, inverter circuits or NAND gates). In this embodiment, the case of n=7 is described. In this case, in the ring oscillator circuit 10, a NAND gate is provided in a first stage, and an output terminal of the NAND gate is series-connected with 14 inverter circuits, and an output terminal of the last inverter circuit is connected with one input terminal of the NAND gate. A reset signal is input to the other input terminal of the NAND gate from the error detecting circuit 20 through a switch SW. The ring oscillator circuit 10 can switch between an active mode and a suspend mode in accordance with the reset signal: in the active mode, the output terminal of the first circuit is connected with the input terminal of the first circuit, and in the suspend mode, the input terminal of the first circuit of the ring oscillator circuit 10 is connected with a ground potential, and the output terminal of the last circuit is disconnected from the input terminal of the first circuit. For example, if the reset signal input to the NAND gate is High level (for example, power supply potential VDD), the NAND gate operates as the first inverter circuit that inverts and outputs an output signal of the last inverter circuit. If the reset signal is Low level (for example, ground potential), an output signal is High level irrespective of the output of the last inverter circuit to stop the oscillation of the ring oscillator circuit 10. Incidentally, this embodiment describes an example of suspending an operation of the ring oscillator circuit 10. However, if the operation of the ring oscillator circuit 10 is not suspended, a setting signal A1 is used to connect the switch SW to the power supply potential VDD side so as not to suspend the operation of the oscillating circuit.

Figure 2:
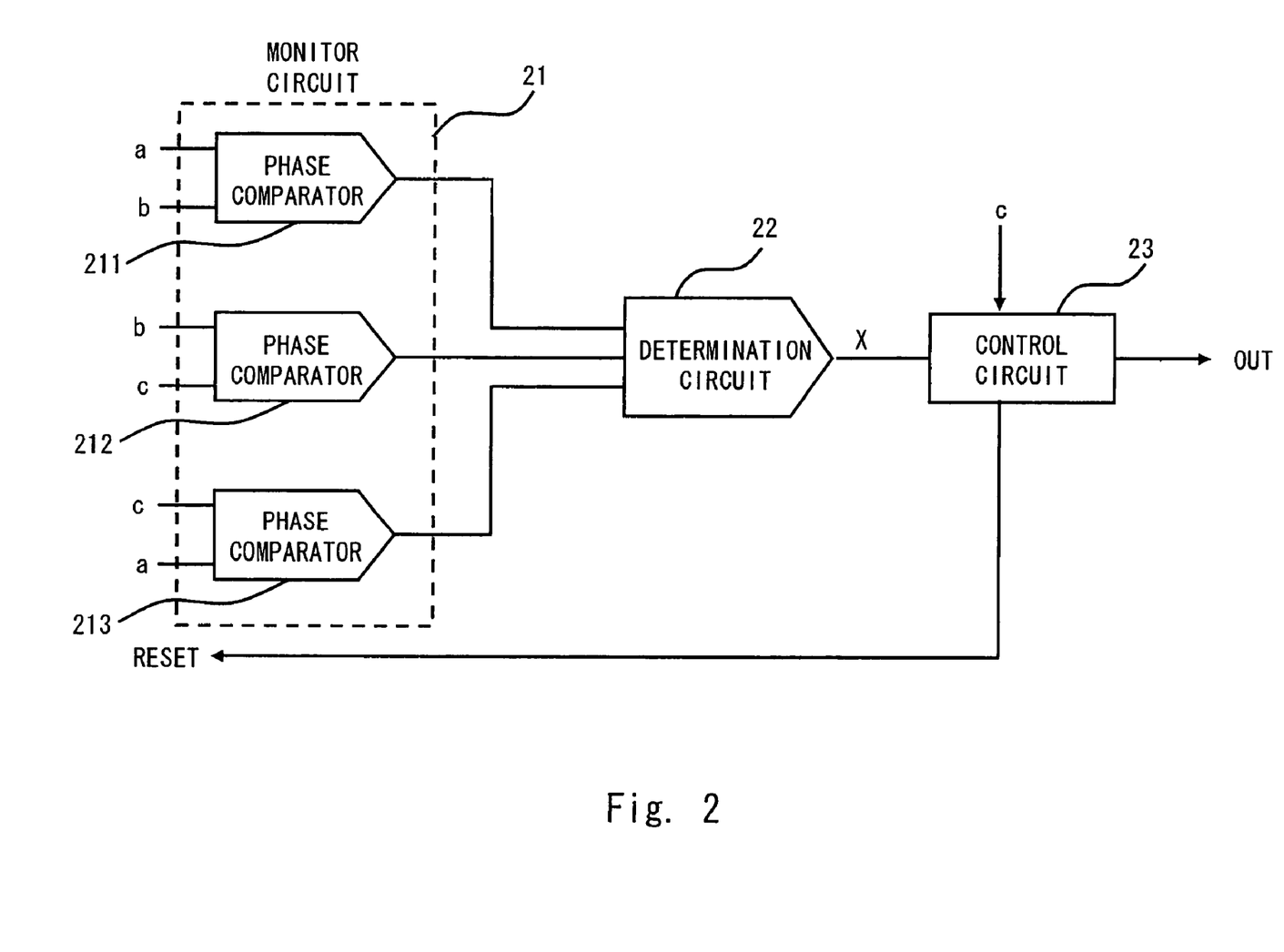
FIG. 2 is a block diagram of the ring oscillator circuit of the first embodiment.

The error detecting circuit 20 detects the occurrences of soft errors based on a phase difference between the output signals at plural contact points of the ring oscillator circuit 10. FIG. 2 is a detailed block diagram of the error detecting circuit 20. Referring to FIG. 2, the error detecting circuit 20 is described in detail.

The error detecting circuit 20 includes a monitor circuit 21, a determination circuit 22, and a control circuit 23. The monitor circuit 21 monitors an output signal of at least a (2n+1)/k-th inverter circuit where k is smaller than n and is a submultiple of 2n+1. In the following description of this embodiment, n=7 and k=3 by way of example. In this embodiment, the monitor circuit 21 includes phase comparators 211 to 213. Each phase comparator receives output signals of the two inverter circuits. If a phase difference between output waveforms of the two inverter circuits is within a predetermined range, a signal of Low level (hereinafter referred to as "0") is output; otherwise, a signal of High level (hereinafter referred to as "1") is output.

This embodiment is described on the assumption that n=7 and k=3, and thus output signals of the fifth (a), tenth (b), and fifteenth (c) inverter circuits are input to the monitor circuit 21. Based on waveforms at each contact point, the phase comparator 211 detects a phase difference ($\phi$a–b) between the point a and the point b, the phase comparator 212 detects a phase difference ($\phi$b–c) between the point b and the point c, and the phase comparator 213 detects a phase difference ($\phi$c–a) between the point c and the point a. The phase comparators are described below in detail.

The determination circuit 22 determines whether or not the phase differences are within a predetermined range based on detection results from the phase comparators 211 to 213 to output a determination signal X. The determination signal X of "0" is output if the phase differences are within a predetermined range, for example. The determination signal X of "1" is output if only one of the phase differences is not within a predetermined range.

The control circuit 23 outputs an output (c) of the last circuit of the ring oscillator circuit 10 as a final output OUT to other blocks of the semiconductor device if the determination signal X is "0". Further, if the determination signal X is "1", the final output OUT is stopped, and the reset signal is changed from "1" to "0" to suspend oscillation of the ring oscillator circuit 10 and notify other blocks of the semiconductor device that an abnormality is detected. In addition, the control circuit 23 has a function of sending an output signal of the oscillating circuit after the elapse of a predetermined period from power-on. Incidentally, when the switch SW is connected with the power supply potential VDD side, the control circuit notifies the other blocks of the semiconductor device that the abnormality is detected without stopping the oscillation of the ring oscillator circuit 10.

Figure 3:
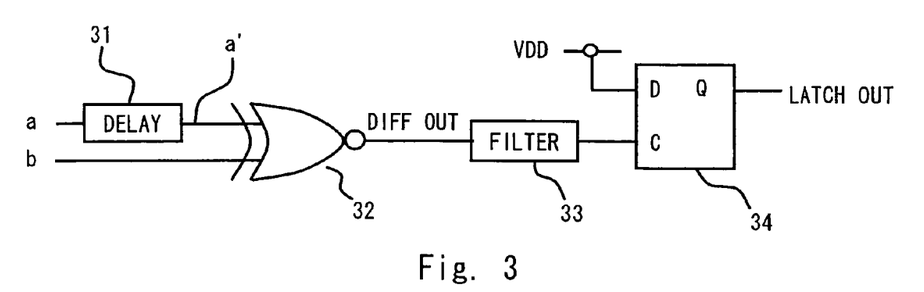
FIG. 3 is a circuit diagram of a phase detecting circuit of the first embodiment.

Here, the phase comparator is described in detail. As an example thereof, FIG. 3 is a circuit diagram of the phase comparator 211 that receives the output waveforms of the fifth and tenth inverter circuits as the input waveform. As shown in FIG. 3, the phase comparator 211 includes a delay circuit 31, an EX-NOR 32, a filter circuit 33, and a D-FF (D-flip-flop) 34. The delay circuit 31 changes an input waveform a to a waveform a' by giving a delay to make the waveform a' substantially in opposite phase with a waveform b. The EX-NOR 32 receives the waveforms a' and b and outputs "1" as Diff_out if the two input waveforms have the same logic type. The filter circuit 33 transmits, if a pulse width of Diff_out is larger than a predetermined width, a signal to a subsequent D-FF. The D-FF 34 includes input terminals C and D, and an output terminal Q. The input terminal D is connected with the power supply potential VDD. When rise edge of an input signal is input to the input terminal C, the D-FF 34 outputs "1" to the output terminal Q as Latch_out.

Figure 4:
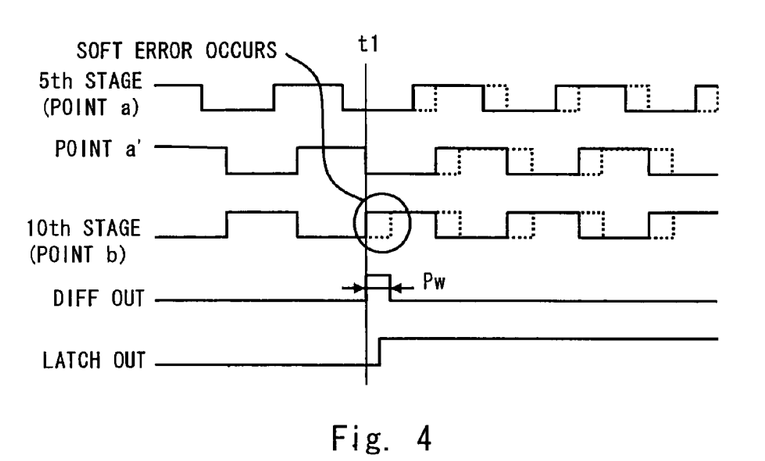
FIG. 4 is a timing chart of an operation of the phase detecting circuit of the first embodiment.

FIG. 4 is a timing chart of operations of the phase comparator 211. Referring to FIG. 4, the operation of the phase comparator 211 is described. The waveform b is similar to the waveform a but has a phase delay relative to the waveform a. In this example, the waveform a is given a phase delay by the delay circuit 31 to make the waveform a' substantially in opposite phase with the waveform b. The waveform a' and the waveform b are input to the EX-NOR 32. Accordingly, Diff_out is kept at "0".

When soft errors occur in the waveform b at time t1, and the level of the waveform b becomes "0" in such a portion that the level would be "1" under ordinary circumstances, the waveform a' is "0" and the waveform b is "0" during a period Pw in which the waveform b is "0", so Diff_out becomes "1". If the period Pw is a predetermined period or more, an active high signal is transmitted to the input terminal C of the D-FF 34, so Latch_out becomes "1".

Figure 5:
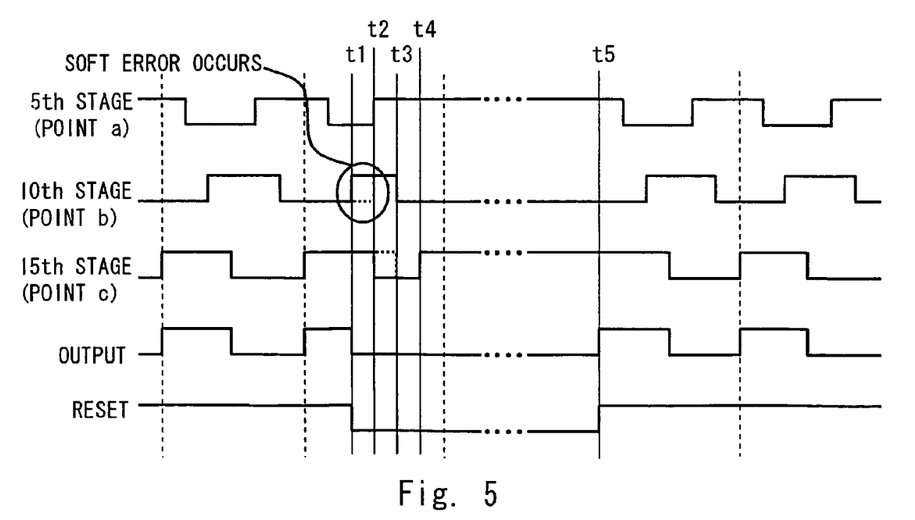
FIG. 5 is a timing chart of operations of the phase detecting circuit and the error detecting circuit of the first embodiment.

FIG. 5 is a timing chart of operations of the ring oscillator circuit 10 and the error detecting circuit 20. Referring to FIG. 5, a soft error detection operation is described in detail. The description is made of an example where soft errors occur in an output (point b) of the 10-th inverter circuit at time t1.

The waveforms at each of the points a to c are normal before the time t1 when the soft errors occur, so the phase comparators 211 to 213 output "0", and the determination signal X is also "0". Hence, the control circuit 23 outputs a signal of the point c as the output OUT. Further, the reset signal from the control circuit is also "0".

When soft errors occur in the point b at time t1, a signal that would be at High level under ordinary circumstances is changed to Low level. Along with this signal change, the phase comparators 211 and 212 that receive the signal of the point b detect a phase abnormality to output "1". Based on the abnormality detecting signal, the determination circuit 22 sets the determination signal X to "1". Based on the determination signal, the control circuit 23 stops the output. Further, the control circuit 23 sets the reset signal to "0".

When the reset signal is "0", the output of the NAND gate of the ring oscillator circuit 10 is fixed at High level. Hence, the output of the 5-th circuit (point a) becomes High level with a predetermined delay at time t2. The output of the 10-th circuit (point b) becomes Low level at time t3. The output of the 15-th circuit (point c) becomes High level at time t4. This state is kept until the reset signal is cancelled (reset signal becomes "1").

When the reset signal is cancelled at time t5, the rest signal input to the NAND gate of the ring oscillator circuit 10 becomes "1", and an output of the NAND gate is changed from High level to Low level, so the ring oscillator circuit resumes oscillation. As a result, the ring oscillator circuit 10 is put into a normal state. The time t5 is a time after a period corresponding to several clock pulses elapses from the time t1.

Further, the reset signal is also supplied to the internal circuit of the semiconductor device. The internal circuit resumes an operation before the reset signal is "1", for example, based on the reset signal or rereads the data.

According to the semiconductor device of the first embodiment, output signals of plural contact points of the ring oscillator circuit 10 are input to the error detecting circuit 20 to detect an abnormality in phase difference between the contact points to suspend the output and generate the reset signal. Thus, since clock pulses different in phase are not transmitted to the internal circuit of the semiconductor device, an operational error of the other block never occurs due to an error in reading data or a timing difference. Further, a processing executed before the clock is stopped is resumed based on the reset signal, so a subsequent abnormal state can be avoided. Incidentally, the oscillation of the ring oscillator circuit 10 may not be suspended based on the state of the switch SW.

A conventional circuit for preventing the SET sends output signals of plural ring oscillator circuits of the same configuration through a majority circuit or a coincidence circuit. In contrast, the semiconductor device of the first embodiment can be composed of one ring oscillator circuit 10 and error detecting circuit 20. Hence, the SET can be prevented while a chip area is reduced.

Further, the control circuit 23 has a function of outputting an output signal of the ring oscillator circuit 10 after the elapse of a predetermined period from power-on, so an unstable oscillation waveform of the ring oscillator circuit 10 after the power-on is not input to the internal circuit, and thus the operation can be stable.

Second Embodiment

Figure 6:
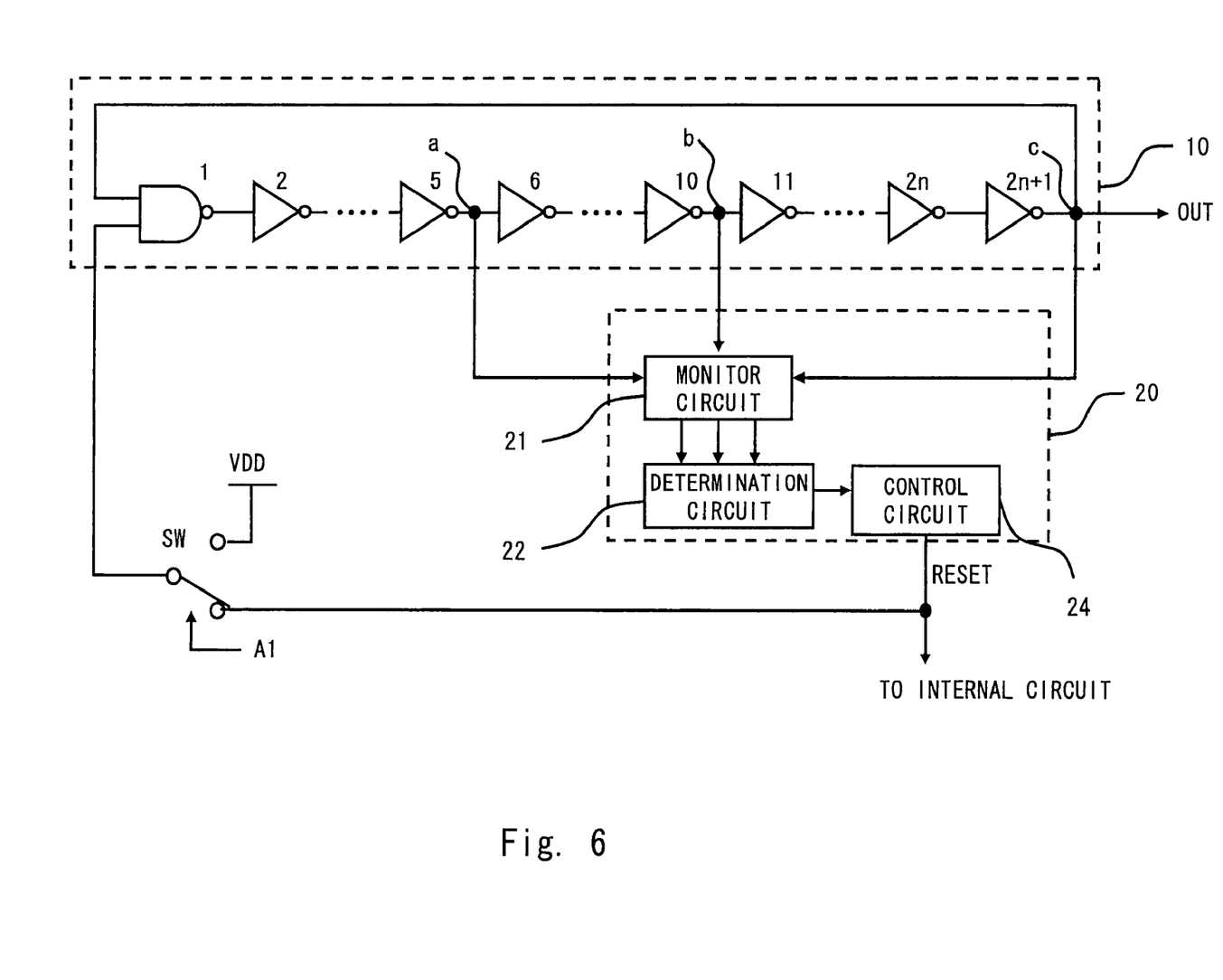
FIG. 6 is a block diagram of a ring oscillator circuit and an error detecting circuit according to a second embodiment of the present invention.

FIG. 6 shows a semiconductor device according to a second embodiment of the present invention. As shown in FIG. 6, the semiconductor device of the second embodiment is different from the semiconductor device of the first embodiment in that the semiconductor device of the first embodiment outputs clock pulses through the control circuit 23 of the error detecting circuit 20, but the device of this embodiment directly supplies clock pulses to the internal circuit from the last circuit of the ring oscillator circuit 10. The same blocks as the first embodiment are denoted by like reference numerals, and description thereof is omitted here.

The control circuit 23 of the first embodiment controls the ring oscillator circuit 10 to output or stop the waveform based on the determination signal X. In contrast, the control circuit 24 of the second embodiment only outputs a reset signal. That is, clock pulses are directly supplied from the output of the ring oscillator circuit to the internal circuit.

The semiconductor device of the second embodiment directly supplies clock pulses from the output of the ring oscillator circuit 10, so the control circuit 24 needs only to have a function of outputting the reset signal. As a result, the configuration of the control circuit 24 is simplified, so the circuit can be more downsized.

Further, the reset signal is supplied to the internal circuit and the NAND gate of the ring oscillator circuit 10. Thus, similar to the first embodiment, when soft errors occur, it is possible to suspend the operation of the ring oscillator circuit 10 and notify the internal circuit of the error occurrence. The internal circuit can resume the processing executed before the soft error occurs or reread data based on the reset signal. As a result, it is possible to prevent the soft error from propagating.

As another embodiment of the present invention, the number of contact points to monitor the waveform of the ring oscillator circuit is not limited to three. The waveform is monitored at more contact points, whereby the soft errors can be detected with higher accuracy. Further, when soft errors occur, instead of stopping the operation of the ring oscillator circuit, the other blocks may execute a processing based on the reset signal.

It is apparent that the present invention is not limited to the above embodiment that may be modified and changed without departing from the scope and spirit of the invention.

What is claimed is:

1. A semiconductor device, comprising:
   a ring oscillating circuit including 2n+1 logic circuits connected in series, where n is an integer of 1 or greater; and
   an error detecting circuit receiving output signals of at least two of the logic circuits and outputting an error detection signal if a phase difference between the output signals is not within a predetermined phase difference range, the error detecting circuit including a monitor circuit which outputs to a determination circuit, and the determination circuit outputs to a control circuit, the monitor circuit including a plurality of phase comparators,
   wherein the at least 2n+1 logic circuits includes at least one of a second to a 2n logic circuit that are connected by the error detecting circuit to a last logic gate of the 2n+1 logic circuits so that each of the plurality of the phase comparators is configured to receive output waveforms of two inverter circuits of the 2n+1 logic circuits such that the determination circuit determines that if a phase difference between output waveforms of the two inverter circuits is within a predetermined range a Low level signal is output to the control circuit or otherwise a High level signal is output to the control circuit, and the control circuit outputs an output of the last circuit of the ring oscillator circuit to OUT if the signal is LOW.

2. The semiconductor device according to claim 1, wherein the error detecting circuit includes:
   the determination circuit determining whether or not the oscillating circuit normally operates based on the detection signal; and
   the control circuit outputting the error detection signal based on a determination result of the determination circuit.

3. The semiconductor device according to claim 1, wherein the monitor circuit monitors an output of at least a (2n+1)/k-th circuit of the logic circuits, and k is smaller than n and is a submultiple of 2n+1.

4. The semiconductor device according to claim 2, wherein the monitor circuit monitors an output of at least a (2n+1)/k-th circuit of the logic circuits, and k is smaller than n and is a submultiple of 2n+1.

5. The semiconductor device according to claim 1, wherein the control circuit has a function of sending an output signal of the oscillating circuit after an elapse of a predetermined period from power-on.

6. The semiconductor device according to claim 2, wherein the error detection signal suspends an operation of the oscillating circuit and notifies other blocks that an error occurs in the oscillating circuit.

7. The semiconductor device according to claim 1, wherein the error detection signal suspends an operation of the oscillating circuit and notifies other blocks that an error occurs in the oscillating circuit.

8. The semiconductor device according to claim 1, wherein an output terminal of the logic gate is series connected with the logic circuits.

9. The semiconductor device according to claim 2, wherein the output signals are taken from nodes that are adjacent to at least two of the logic circuits therebetween.

10. The semiconductor device according to claim 2, wherein the output signals are taken from three connecting points of the logic circuits.

11. A semiconductor device, comprising:
    a ring oscillating circuit including 2n+1 logic circuits connected in series, where n is an integer of 1 or greater, the plurality of logic circuits being a logic gate having an output terminal series connected to a plurality of inverter circuits, and an output terminal of a last inverter circuit is connected to an input terminal of the logic gate; and
    an error detecting circuit receiving output signals of at least two of the logic circuits and outputting an error detection signal if a phase difference between the output signals is not within a predetermined phase difference range, the error detecting circuit including a monitor circuit which outputs to a determination circuit, and the determination circuit outputs to a control circuit, the monitor circuit including a plurality of phase comparators,
    wherein the at least 2n+1 logic circuits includes at least one of a second to a 2n logic circuit that are connected by the error detecting circuit to the logic gate of the 2n+1 logic circuits so that each of the plurality of the phase comparators is configured to receive output waveforms of two inverter circuits of the 2n+1 logic circuits such that the determination circuit determines that if a phase difference between output waveforms of the two inverter circuits is within a predetermined range a Low level signal is output to the control circuit or otherwise a High level signal is output to the control circuit, and the control circuit outputs an output of the last circuit of the ring oscillator circuit to OUT if the signal is LOW.

12. The semiconductor device according to claim 11, wherein the error detecting circuit includes:
    the determination circuit determining whether or not the oscillating circuit normally operates based on the detection signal; and
    the control circuit outputting the error detection signal based on a determination result of the determination circuit.

13. The semiconductor device according to claim 12, wherein the monitor circuit monitors an output of at least a (2n+1)/k-th circuit of the logic circuits, and k is smaller than n and is a submultiple of 2n+1.

14. A semiconductor device, comprising:

a ring oscillating circuit including 2n+1 logic circuits connected in series, where n is an integer of 1 or greater; and a soft error detecting circuit receiving output signals of at least two of the logic circuits and outputting an error detection signal if a phase difference between the output signals is not within a predetermined phase difference range, the soft error detecting circuit including a monitor circuit which outputs to a determination circuit, and the determination circuit outputs to a control circuit, the monitor circuit including a plurality of phase comparators, wherein the at least 2n+1 logic circuits includes at least one of a second to a 2n logic circuit that are connected by the error detecting circuit to a last logic gate of the 2n+1 logic circuits so that each of the plurality of the phase comparators is configured to receive output waveforms of two inverter circuits of the 2n+1 logic circuits such that the determination circuit determines that if a phase difference between output waveforms of the two inverter circuits is within a predetermined range a Low level signal is output to the control circuit or otherwise a High level signal is output to the control circuit, and the control circuit outputs an output of the last circuit of the ring oscillator circuit to OUT if the signal is LOW, wherein the soft error detecting circuit is configured to detect soft errors caused by radiation.

15. The semiconductor device according to claim 14, wherein the semiconductor device is configured to supply a reset signal to an internal circuit of the ring oscillator circuit and the logic gate of the ring oscillator circuit, such that when soft errors occur, operation of the ring oscillator circuit and notify an internal circuit of the soft errors is suspended.

16. The semiconductor device according to claim 15, wherein the semiconductor device is configured so that a processing executed before the soft error occurs or reread data based on the reset signal is resumed by the internal circuit, whereby the soft error is prevented from propagating.

* * * * *